United States Patent [19]

Coutellier et al.

[11] Patent Number: 5,042,140

[45] Date of Patent: Aug. 27, 1991

[54] PROCESS FOR MAKING AN APPARATUS UTILIZING A LAYERED THIN FILM STRUCTURE

[75] Inventors: Jean-Marc Coutellier, Maurepas; Alain Jacombelli, Saint Michel Sur Orge; François Maurice, Verrieres Le Buisson; Paul L. Meunier, Paris, all of France

[73] Assignee: Compagnie Europeenne de Composants Electroniques LCC, Courbevoie, France

[21] Appl. No.: 506,904

[22] Filed: Apr. 10, 1990

[30] Foreign Application Priority Data

Apr. 14, 1989 [FR] France ................ 89 04966

[51] Int. Cl.⁵ .............................................. G11B 5/42
[52] U.S. Cl. ...................... 29/603; 360/119; 360/122
[58] Field of Search ............ 29/603; 360/119–122, 360/125, 126, 127

[56] References Cited

U.S. PATENT DOCUMENTS

| | | | |
|---|---|---|---|
| 3,499,214 | 3/1970 | Schneider | 29/603 |
| 4,670,972 | 6/1987 | Sakakima | 29/603 |
| 4,821,403 | 4/1989 | Rolland et al. | |
| 4,849,842 | 7/1989 | Meunier et al. | |
| 4,897,747 | 1/1990 | Meunier et al. | |

FOREIGN PATENT DOCUMENTS 1159994 7/1958 France .

OTHER PUBLICATIONS

T. Hamaguchi et al., "Novel LSI/SOI Wafer Fabrication Using Device Layer Transfer Technique", IEDM 85, Technical Digest, 1985, IEEE New York, pp. 688–691.
Patent Abstracts of Japan, vol. 9, No. 239, Sep. 25, 1985, & JP-A-60 093610.
Patent Abstracts of Japan, vol. 6, No. 30 (P-102) (908) Feb. 23, 1982 and JP-A-56 148713.

*Primary Examiner*—Carl E. Hall
*Attorney, Agent, or Firm*—Pollock, VandeSande & Priddy

[57] ABSTRACT

A process of manufacturing an apparatus incorporating a layered thin film structure, wherein said process more particularly obviates the need to repeat on a first part of the apparatus the effects of certain operations required to produce the second part formed by the layered thin film structure. For this purpose, the process consists of utilizing a substrate to produce an intermediate assembly (12) comprising the thin film structure (11), then attaching the intermediate assembly (12) to the first part (10), then at least partially eliminating the intermediate substrate (13).

4 Claims, 4 Drawing Sheets

PROCESS FOR MAKING AN APPARATUS UTILIZING A LAYERED THIN FILM STRUCTURE

The invention relates to an apparatus formed of at least two parts which are integrally joined together, wherein one of the parts is made of a layered thin film type structure. The invention may particularly (but not exclusively) be advantageously applied to the production of hybrid magnetic heads, especially those having a planar structure. These magnetic heads are composed, first, of a main body (forming one of the parts) made of one or more assembled parts (of ferrite, for example) and forming a magnetic field shutoff circuit (which may, in a conventional manner, comprise one or more coil or coils); and second, of a structure (forming the other part) mounted on the main body. This structure is formed by layered thin films arranged such that they constitute the poles, which are separated by an air gap, and form the active surface of the magnetic head.

The techniques used to manufacture substrates forming a magnetic circuit are well known and are described, more particularly, in French patent applications No. 86 14974, No. 88 08526, No. 87 14824, No. 88 08527.

In addition, French patent applications No. 87 14824 and No. 86 14974 describe an example of an embodiment of active surfaces for magnetic heads employing layered thin film technology.

As indicated in the last of the aforesaid patent applications, in addition to improving the useful characteristics of a magnetic read and/or write head, this type of magnetic head lends itself to production in large series, thereby resulting in substantial cost reductions.

Indeed, a plurality of such magnetic heads may be simultaneously produced on the same substrate which is then cut to form individual magnetic heads.

FIG. 1 illustrates an example of a substrate of the aforesaid type, which is in itself described in a French patent application No. 87 14824, which is hereinafter described.

FIG. 1 is a perspective drawing showing an assembly designed to simultaneously form a plurality of magnetic heads. This assembly is formed from a substrate 1, made of a magnetic material (a block of ferrite, for example). The substrate 1 comprises an attached plate 3, made of a magnetic material, and before this plate 3 has been attached to the substrate 1, parallel notches 2 are cut in said substrate, through thickness E of the substrate 1; and a narrowed area 4 is made at the base of each notch, such that one notch together with one narrowed area will not come into contact with a surface 8 of the substrate 1 opposite the plate 3.

The narrowed areas 4 are then filled with a nonmagnetic material, by pouring a glass-based material, for example.

The plate 3 is then affixed to the substrate 1 and, finally, the substrate 1 is machined along the surface 8 to remove a part 5 (shown in dotted lines) of said substrate opposite the plate 3 until the narrowed areas 4 appear on a new surface 9, and machining is continued until air gaps 6 (made of the nonmagnetic material) of the desired width are obtained. Of course, the narrowed areas 4 may be in the shape of a triangle as shown in dotted lines for narrowed area 4a.

The structure formed in this manner is then cut into individual magnetic circuits. The cutting is performed along planes such as plane P which are situated between the notches and lie parallel to the axis of the notches. Since the structure of FIG. 1 lies within a trihedron XYZ, with surfaces 10 and 11 being parallel to the plane XZ, planes such as plane P are parallel to plane ZY.

Cutting is then also performed along planes which are not represented and lie parallel to plane YX.

In a subsequent stage, each magnetic circuit CM is supplied with a coil 7 as shown in FIG. 2. This coil is wound through the notch 2 around one section of the magnetic circuit CM.

In the case of a thin film magnetic head, the active surface 9 comprising the air gap 6 is coated with a layer (not shown) of a highly magnetic material such as the material known as Sendust ($Fe_x Si_y Al_z$). This operation may also be performed prior to cutting into individual magnetic circuits. This coating of a highly magnetic material covers the surface 9 and part of the air gap 6 of each magnetic circuit, such that it forms the two poles of the magnetic head.

Thus, the substrate from which the magnetic field closing circuit is formed more generally constitutes a host substrate for the layer or layers of thin film.

Regardless of the basic thin film technology employed to create the active surface of the magnetic head, according, for example, to the teachings of either of the two aforesaid patent applications, this technology displays the following significant disadvantages.

The substrate surface intended to receive the layer or layers of thin films, that is, the substrate forming the magnetic circuit, must be polished to perfection so as to display surface characteristics that are compatible with the depositing of thin films.

Furthermore, it is difficult to obtain the desired polished finish on the substrate surface without producing a difference in height between the ferrite surface (which is hard) and the nonmagnetic material, for example, glass (contained in the narrowed area 4) which forms the macroscopic air gap and which is not as hard. This results in the formation of a fracture zone which alters the quality of the thin film.

It is often necessary to refire the magnetic thin films deposited on the substrate forming the magnetic circuit, or the field shutoff substrate, and refiring temperatures may be incompatible with the materials used in conjunction with or in the production of this substrate (ferrite forming the magnetic circuit, glass or other nonmagnetic material used as adhesives in the ferrite parts or as fillers for the macroscopic air gap).

The magnetic poles are defined by etching in the final stages of production. The active surface of the head is therefore not plane, since the poles protrude from the surface of the ferrite substrate. Thus, when a wear-resistant film is deposited on the surface of the head, the ridges of the pole edges form brittle areas in this film.

The invention relates to a process which obviates these disadvantages and, of course, the invention applies not only to the specific case of producing magnetic heads using thin-film technology, but also to all cases involving the production of an apparatus comprising at least two parts, wherein one part comprises at least one layer of thin film and the other part forms a host substrate to receive said layer.

SUMMARY OF THE INVENTION

According to the invention, a process to make an apparatus comprising a structure of the thin film type formed of at least one layer of thin film, wherein said layered thin film structure is carried by a host substrate, is characterized in that it consists of depositing said layer of thin film on an intermediate substrate to produce an intermediate assembly, then to attach the intermediate assembly to the host substrate such that the latter is integrally joined to the intermediate assembly. The layer of thin film is situated on the same side as the host substrate. Finally at least part of the intermediate substrate is eliminated to allow only a useful part of the layered thin film structure to remain.

The invention shall be more clearly understood and the other advantages it presents shall be made apparent in the following description which is provided as a non-limiting example and refers to the appended drawings.

DESCRIPTION OF THE PREFERRED EMBODIMENT

Figure 3:
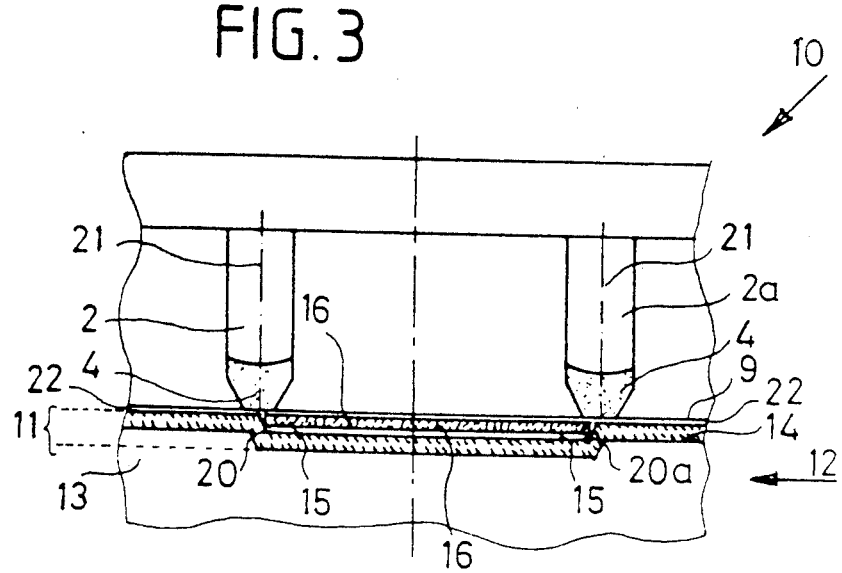
FIG. 3 is a schematic drawing of a characteristic stage of the process of the invention and shows a cross-sectional view of a host substrate which is similar to that shown in FIG. 2, and an intermediate assembly attached to the host substrate.

As non-limiting example, FIG. 3 illustrates an application of the invention to the fabrication of magnetic read and/or wire heads.

Figure 1:
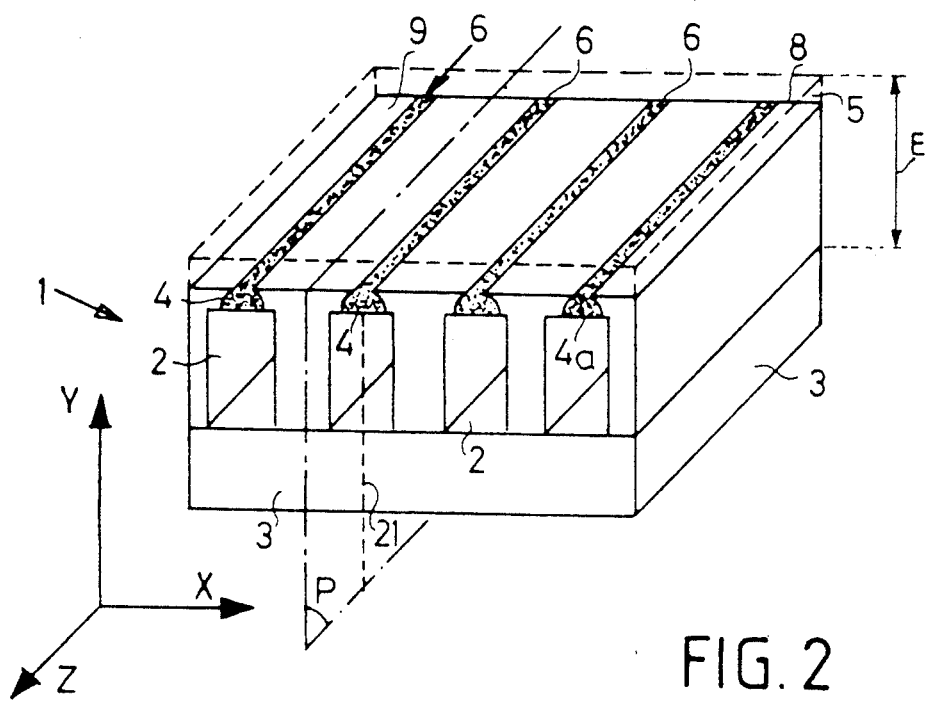
FIG. 1 described in the foregoing, shows a known substrate of a magnetic material which serves to produce a plurality of magnetic heads and which may constitute a host substrate for one or more layer or layers of thin film.

FIG. 3 represents a host substrate 10 formed of a support or substrate of a magnetic material, which is similar to the substrate shown in FIG. 1, viewed through a section along plane Y-X of FIG. 1. In the example of FIG. 3, only two notches, 2, 2a are represented, wherein each notch corresponds to a row of magnetic heads and wherein, at the end of the process these two rows are separated by cutting along the dotted lines; and all individual magnetic heads are cut out as mentioned in the foregoing introductory remarks.

FIG. 3 further shows a structure 11 with one or more layer or layers of thin film. The layered thin film structure 11 is formed on a substrate which shall henceforth be referred to as the intermediate substrate 13 in the following description, and which, together with the layered thin film structure 11, forms an intermediate assembly 12.

This illustrates an important characteristic of the process of the invention, which consists of making at least part of the thin film structure 11 on a substrate other than the one which is designed to ultimately receive this structure, then to attach the intermediate assembly 12 to the ultimate substrate or host substrate 10, contrary to the prior art processes wherein the layer or layers of thin film are deposited and processed on the host substrate.

Figure 2:
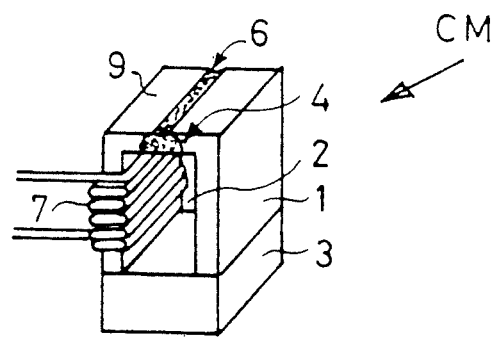
FIG. 2, described in the foregoing, shows a known magnetic circuit produced by cutting the substrate illustrated in FIG. 1.

In the non-limiting example described, during this stage of the process, the thin film structure 11 is formed by depositing three superimposed layers which are designed to form, for each magnetic head, two poles separated by a microscopic air gap, as opposed to the macroscopic air gap formed by each narrowed area 4 shown previously in FIG. 1 and FIG. 2. Of course, to make the active surface of a magnetic head such as the one shown in FIG. 2, the intermediate substrate 13 may carry a single layer of magnetic material.

Of the three superimposed layers of thin film 14, 15, 16 carried by the intermediate substrate 13, the middle layer 15 is a layer of nonmagnetic material (alumina or silica, for example) designed to form microscopic air gaps 20, 20a.

As shown in FIG. 3, the intermediate assembly 12 is positioned on the host substrate 10 such that the microscopic air gaps 20 are substantially located along longitudinal axes 21 of notches 2, wherein the layers of thin film 14, 15, 16 are oriented toward the narrowed areas 4, that is, toward surface 9 of the host substrate which is in contact with the narrowed areas 4.

The host substrate 10 and the intermediate assembly 12 are integrally joined together by conventional means, for example, using an adhesive substrate such as an epoxy glue, for example, or molten or powdered glass. The adhesive is placed between the host substrate 10 and the intermediate assembly 12, and these two parts are pressed together by conventional means (not shown) until the adhesive forms an intermediate layer 22 which is relatively thin, on the order of 5 micrometers, for example; but wherein this intermediate layer is nonetheless sufficiently thick to compensate for irregularities or surface roughness which may be present on the surface 9 of the host substrate after any possible cursory polishing operation.

This highlights a major advantage provided by the process of the invention, which resides in the fact that, in addition to acting as an adhesive, the intermediate layer 22 compensates for irregularities and surface roughness, thereby obviating the need for a very high quality polishing stage.

Figure 4A:
FIGS. 4a and 4b are cross-sectional views schematically illustrating an intermediate substrate as shown in FIG. 3, before and after an etching stage.
Figure 4B:
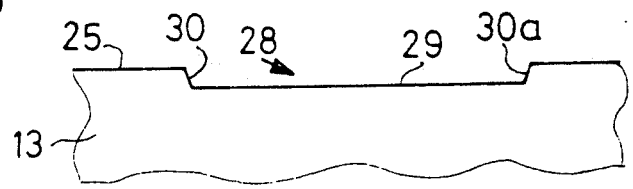

FIGS. 4a and 4b illustrate the preparation of the intermediate substrate 13 for receiving the thin film deposits.

The substrate 13 may be made of any material, however this material shall preferably be suitable for etching using techniques currently employed in the field of thin-film technology, and particularly using conventional chemical masking and etching techniques. This material must also have the capacity to withstand the temperatures (on the order of 500° C., for example) required for refiring the thin films (when such refiring is necessary), and it must display an expansion coefficient which is compatible with those of the thin films; in sum, the material used for the intermediate substrate 13 is chosen for its compatibility with the processing requirements for thin films.

Thus, given the nature of thin films (which is explained hereinafter), a semiconducting material may be suitable for use in forming the intermediate substrate, such as silicon, for example, or any other type of material such as, for example, germanium, glass, etc.

One surface 25 of the intermediate substrate 13 may be processed such that it displays a maximum surface roughness of a few hundredths of a micrometer. This degree of surface roughness is perfectly acceptable and will not undermine the properties of the thin films, and it may be readily achieved using conventional mechanical planing techniques.

The microscopic air gaps 20, 20a shown in FIG. 3 are created using etched stairs in the intermediate substrate 13, and the edges of the stairs must be well defined in order to produce air gaps that are as rectilinear as possible; this may be achieved by chemical, mechanical or other etching processes.

To this end, according to one characteristic of the process of the invention, the intermediate substrate 13 is made of a monocrystalline semiconducting material. Monocrystalline silicon, for example, is well suited, because techniques are known for chemically etching thereon stairs having edges which exactly follow the crystallographic axes.

Gallium arsenide GaAs, for example, may also be used for this purpose.

On the surface 25 of the intermediate substrate 13, there is deposited in a conventional manner a resin mask 26, such that there appears a cleared area 27 (FIG. 4a).

The silicon of the intermediate substrate 13 is etched in the cleared area 27 according to a conventional technique, by a chemical process, for example; the resin of mask 26 is then dissolved with an appropriate product. The intermediate substrate 13 then appears as shown in FIG. 4b, with a hollow or recessed area 28 in the space where the cleared area 27 was previously located, wherein the bottom 29 of this hollow rejoins the surface 25 by stairs 30, 30a having nearly rectilinear edges.

Using the conventional method of cathode disintegration or another conventional method such as chemical vapor deposition (CVD), the layers of thin film 14, 15, 16 are then deposited on the surface 25 and the hollow 28.

Figure 5:
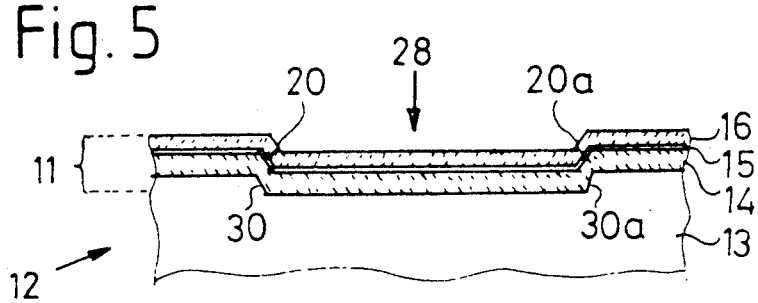
FIG. 5 is a cross-sectional view schematically illustrating the intermediate substrate coated with three layers of thin film.

FIG. 5 shows the intermediate substrate 13 after the layers of thin film have been deposited thereon, that is, when it carries the thin film structure 11.

The first deposited layer 14 is a layer of a highly magnetic material such as that known as Sendust ($Fe_x Si_y Al_z$) with a thickness ranging from 1 to 5 micrometers, for example.

On top of the first layer 14 is the second layer 15 of a nonmagnetic material, which may be alumina or silicon, for example. This second layer 15 of a nonmagnetic material is designed to form the air gaps 20, 20a on the stairs 30, 30a and the thickness of these air gaps is dependent only on the thickness of the second layer 15 which may range from 0.1 to 1 micrometer, for example.

Of course, in the figures, the dimensions are not drawn to scale, so as to improve the clarity of these figures.

On top of the second layer 15 is the third layer 16 of a magnetic material. The third layer 16 is of a type and thickness similar to that of the first layer 14. It should be noted that the layers of thin film 14, 15, 16 perfectly conform to the shape of the hollow or recessed area 28 produced in the intermediate substrate.

Thus, the first, then second, then third layers 14, 15, 16 are superimposed such that, during the process of depositing these layers, that is, from the time the first layer 14 is deposited until the time the third layer 16 is deposited, it is not necessary to remove the intermediate assembly 12 from the enclosure in which these deposits are made. Indeed, no photolithography stage is needed between deposits, thus eliminating all problems related to resin clean-up, while, in the prior art, such clean-up operations were essential to ensure proper adhesion among the layers.

Figure 6:
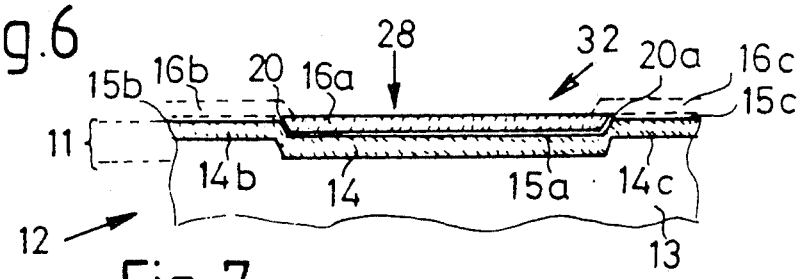
FIG. 6 is a cross-sectional view schematically illustrating the intermediate substrate of FIG. 5 following a polishing stage designed to create an air gap.

FIG. 6 shows the intermediate assembly 12 following a conventional polishing process, which is designed to remove, from each side of the hollow or recessed area 28, parts 16b, 16c of the third layer and parts 15b, 15c (shown in dotted lines) of the second (nonmagnetic) layer, such that, in this phase of the process, there remains only: the first layer 14 (complete); a center part 15a of the second layer (located in the hollow 28) and the air gaps 20, 20a formed over the stairs 30, 30a; a center part 16a of the third layer 16.

This process results in the emergence of a surface 32 of the layered thin film structure 11 which is formed by:
peripheral parts 14b, 14c of the first magnetic layer 14, which are located on either side of the hollow 28;
the center part 16a of the third layer 16 of a magnetic material;
one extremity of each air gap 20, 20a which allows the magnetic center part 16a (of the third layer 16) to be detached from the magnetic peripheral parts 14b, 14c (of the first layer 14); and,
the nonmagnetic center part 15a is interposed between the magnetic center parts 14a, 16a.

The host substrate 10 (or field shutoff substrate) and the intermediate assembly 12 are integrally joined in the manner indicated in reference to FIG. 3.

The following procedure is employed to eliminate the intermediate substrate 13 by a chemical, mechanical or other process, and to remove the center part 14a from the first layer 14 and to potentially eliminate all or part of the nonmagnetic center part 15c of the second layer 15.

Figure 7:
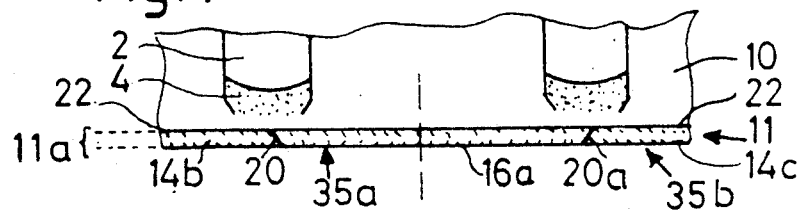
FIG. 7 is a cross-sectional view schematically illustrating the host substrate coated with two layers of magnetic thin film situated in the same plane and separated by an air gap, and forming a rough outline of a magnetic head after removal of the intermediate substrate.

As shown in FIG. 7, there is obtained the host substrate 10 carrying the thin film structure 11 (which is now reduced to a functional part 11a) via the intermediate assembly layer 22, wherein the structure 11 is formed of magnetic layers 14b, 16a, 14c situated in the same plane and separated by the air gaps 20, 20a and forming the active surfaces 35a, 35b opposite the host substrate 10.

The only remaining procedure is to etch the shape of the magnetic poles on the active surfaces 35a, 35b, as described, for example in French patent application No. 87 14822.

Figure 8:
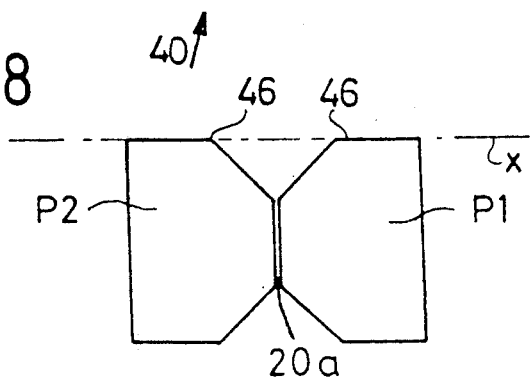
FIG. 8 illustrates a non-limiting example of a shape imparted to the poles of a magnetic head.

The shape of the magnetic poles may be that represented by the non-limiting example in FIG. 8, which shows the shape of a first pole and a second pole, P1, P2, which may be made on either side of an air gap 20, 20a, air gap 20a for example. In this case, the poles P1, P2 are depicted in a view from above as indicated by an arrow 40 in FIG. 7; wherein the first pole P1 is made in the magnetic peripheral layer 14c and the second pole P2 is made in the magnetic center layer 16a.

In order to etch the magnetic poles P1, P2, the following process may be adopted, wherein the simplicity of the process is such that the method does not require illustration:

a photosensitive resin or coating is deposited on the active surfaces;

this coating is masked one or more times using a mask of the shape and dimensions that are to be imparted to the poles P1, P2;

the masked photosensitive coating is exposed; and after removing the resins and masks, etching may be performed using a conventional method (chemical etching, ionic etching, plasma etching) in order to produce the poles P1, P2. Of course, with this method, the poles P1, P2 protrude from the surrounding surface.

With respect to the fabrication and/or the assembly of the coil or coils (not shown), this may be accomplished in the manner described, for example, in French patent application No. 86 14975; or it may be done after cutting or separating each individual magnetic head, wherein the coil or coils may be wound around one section of the magnetic circuit through the notches 2, 2a.

The following description relates to a preferred embodiment of the process according to the invention which provides for obtaining magnetic poles that are embedded in the intermediate substrate 13, that is, that do not protrude relative to the surrounding surface.

Figure 9A:
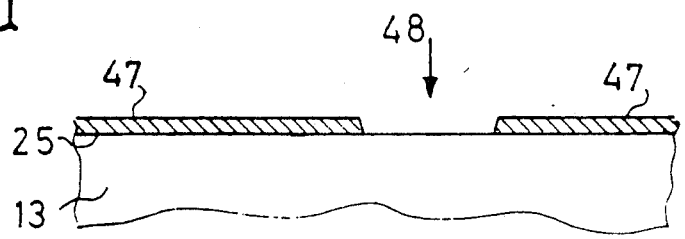
FIGS. 9a, 9b illustrate one stage of the process concerning a masking and etching procedure relating to a first magnetic pole, in a preferred embodiment of the invention which provides for forming the magnetic poles on the intermediate assembly, that is, prior to removal of the intermediate support.
Figure 9B:
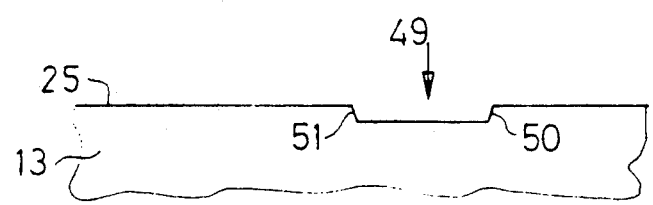

FIGS. 9a and 9b illustrate operations that allow for producing in the intermediate substrate 13 the imprint of a magnetic pole having a shape similar to that of magnetic poles P1, P2 shown in FIG. 8. FIGS. 9a, 9b are longitudinal cross-sections along an axis X shown in FIG. 8 and along which are situated the longitudinal sides 46 of poles P1, P2.

A mask is made on the surface 25 of the intermediate substrate 13. After it has been developed, there emerges a cleared area 48 having the shape of a magnetic pole as shown in FIG. 8. In FIG. 9a, this form is represented along the length of a side 46 of this magnetic pole.

After etching the cleared area 48 using a chemical process, for example, and removing the resin of the mask 47, there appears in the surface 25 a hollow 49 having the shape of a magnetic pole and which rejoins the surface 25 by rectilinear stairs 50, 51.

Figure 10A:
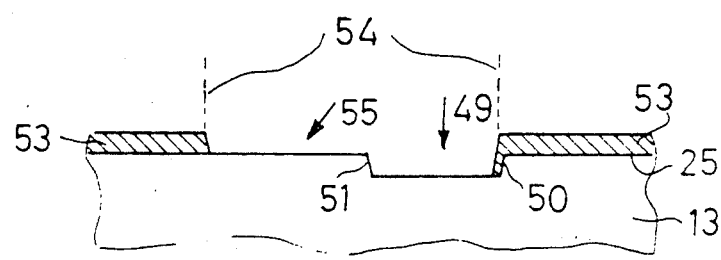
FIGS. 10a, 10b schematically illustrate a masking and etching stage relating to both magnetic poles.
Figure 10B:
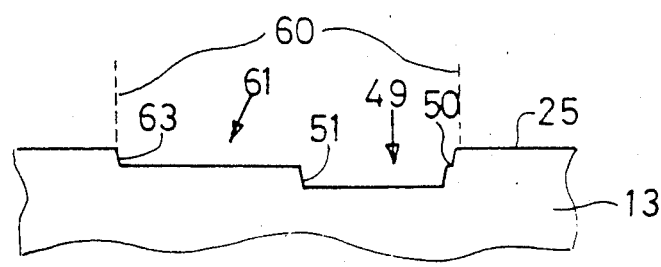

FIGS. 10a and 10b illustrate a stage in the process providing for the creation of another hollow which is symmetrical to the foregoing hollow in order to form the second pole and by increasing the depth of the aforesaid hollow 49.

For this purpose, a second mask 53, which is in the shape of the two poles, is placed on the surface 25 of the intermediate substrate 13, such that there appears a new cleared area 54 formed by the hollow 49 and an additional cleared area 55 in the shape of the second magnetic pole.

On the side of the existing hollow 49, which forms an initial pattern, the superimposition of the second pattern to be produced must be as accurate as possible but is not overly critical in nature. Preferably, the second mask 53 shall be somewhat offset relative to the first mask, as illustrated in FIG. 10a where it covers the stair 50.

FIG. 10b shows that, after etching the cleared area 54 and removing the mask 53, in the place of the cleared area 54, there is formed, in the surface 25 of the intermediate substrate 13, a dual-level compartment 60. The compartment 60 is formed by the hollow 49, the depth of which has increased, and by a hollow 61 which replaces the last cleared area 55 and which, on the one part, rejoins the surface 25 by a new stair 63 and, on the other part, rejoins the bottom of the hollow 49 by the stair 51 or intermediate stair located substantially in the center of the compartment 60.

Figure 11:
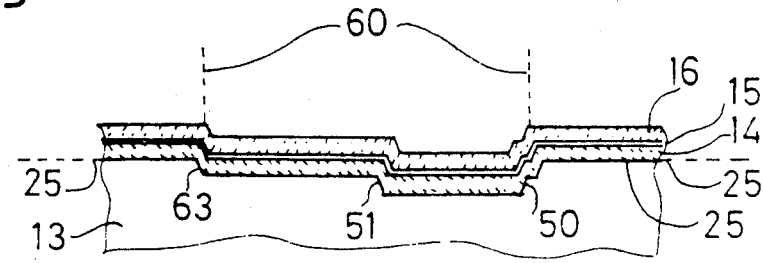
FIG. 11 schematically illustrates the successive deposits of three layers of thin film on the intermediate substrate and shows the result of polishing, which directly causes the two magnetic poles separated by the air gap to appear.

FIG. 11 shows the three layers 14, 15, 16 which were deposited on the intermediate substrate 13 and more particularly in the compartment 60, and which are superimposed as in the preceding example and which conform to the shape of stairs 63, 51, 50.

A subsequent procedure consists of eliminating the parts of these thin films which lie outside the compartment 60. This may be accomplished, as in the foregoing example, by performing a polishing operation to eliminate any material protruding from surface 25 of the intermediate substrate 13, wherein said surface 25 is defined by a dotted line in FIG. 11.

Figure 12:
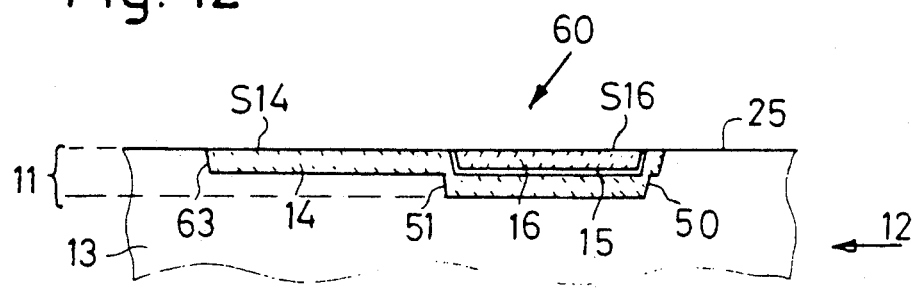
FIG. 12 represents the intermediate assembly following a polishing or planing stage of the layered thin film structure shown in FIG. 11.

As shown in FIG. 12, as a result of this polishing operation S14 and S16 there emerge, in the same plane as that of surface 25, surfaces of the layers 14 and 16 of magnetic material situated in the compartment 60. The second, nonmagnetic layer 15 separates these two magnetic layers 14, 16, and the extremities of this second, nonmagnetic layer appear at the level of stair 50 and intermediate stair 51.

The intermediate assembly 12 produced in this manner can be integrally joined to the host substrate 10 in a manner similar to that described in the foregoing example. Of course, unlike the preceding situation, in this embodiment of the invention, the shape of the magnetic poles P1, P2 is already etched in the magnetic layers 14, 16.

Figure 13:
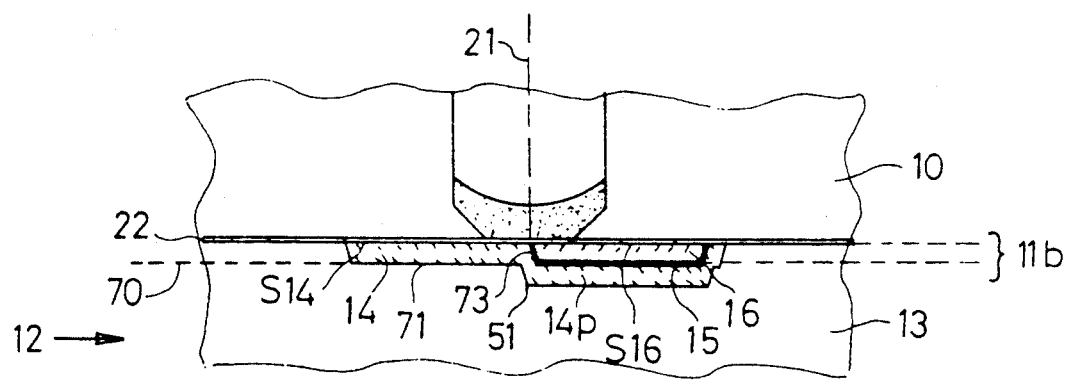
FIG. 13 schematically illustrates the stage wherein the intermediate assembly is attached to the host substrate in the preferred embodiment of the process of the invention.

FIG. 13 shows the host substrate 10 integrally joined to the intermediate assembly 12 through the intermediate layer 22, and with surfaces 25, S14, S16 oriented toward the host substrate 10, and the intermediate stair 51 substantially centered on axis 21 of notch 2. The second, nonmagnetic layer 15 at this point forms a stair which is designed to create an air gap 73.

A subsequent stage in the process of the invention consists of partially eliminating the intermediate substrate 13 and a part of the first magnetic layer 14 located at the deepest level in the intermediate substrate 13, wherein this deep section of the magnetic thin film is identified as 14P in FIG. 13. Indeed, this operation consists of eliminating all material located beyond a plane represented by a dotted line 70, which corresponds to a lower surface 71 of the first layer 14 in the part where this layer is retained, that is, opposite the surface S14. As a result, only a functional part 11b of the structure is retained.

Figure 14:
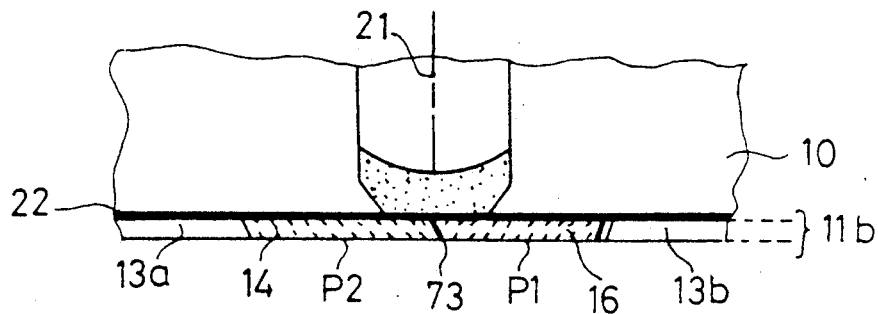
FIG. 14 schematically represents the host substrate carrying the layered thin film structure, after removal of the intermediate substrate.

FIG. 14 illustrates the outcome of this operation. It is apparent that the functional part of the thin film structure 11b is integrally joined to the host substrate 10 and that, unlike the foregoing embodiment, the two magnetic poles P1, P2 are already formed, and represented, respectively, by a part of the first layer 14 and a part of the third layer 16. The two poles P1, P2 are separated by a microscopic air gap 73 produced by the second, nonmagnetic film 15.

It is further apparent that in this embodiment of the process of the invention, the magnetic poles P1, P2 are embedded between the remaining parts 13a, 13b of the substrate 13 such that the active surface is, in this case, perfectly flat.

We claim:
1. A process for making magnetic heads comprising:
   (a) forming a cleared area having the shape of a magnetic pole on the surface of an intermediate substrate;
   (b) making a first hollow in the location of the cleared area;
   (c) making on the surface of the intermediate substrate a mask which comprises the shape of the first magnetic pole opposite the hollow and which at least partially reduces this hollow and forms a second cleared area which is contiguous to the first hollow and has the shape of the second magnetic pole, the mask thus forming a new cleared area corresponding to two magnetic poles positioned symmetrically;
   (d) etching the first and second cleared areas so as to produce a dual-level compartment formed by the first hollow and by a second hollow which is shallower than the first, forming two cavities being separated by an intermediate step;
   (e) depositing in the compartment three layers of thin film which are, respectively, magnetic, nonmagnetic and magnetic thereby forming an intermediate assembly;
   (f) eliminating all material which protrudes from the surface of the intermediate substrate;
   (g) integrally joining the intermediate assembly to a host substrate such that the intermediate substrate is opposite the host substrate; and,
   (h) eliminating a part of the first layer forming the deepest layer in the first hollow and eliminating a part of the intermediate substrate which protrudes from a plane containing a lower surface of a remaining part of the first magnetic layer, such that all that remains of the intermediate assembly is a functional part formed of a portion of the first magnetic layer and a portion of the third magnetic layer, wherein those two magnetic layers are separated by an air gap formed over the intermediate assembly by a remaining part of the second, nonmagnetic layer, wherein the two remaining parts of the magnetic layers form magnetic poles.

2. A process as claimed in claim 1, wherein the intermediate assembly and the host substrate are attached by means of an adhesive substance which forms an intermediate layer between the intermediate assembly and the host substrate, said intermediate layer having a thickness sufficient to compensate for irregularities or surface roughness that maybe present on the host substrate.

3. A process as claimed in claim 1 wherein the intermediate substrate is produced using a semiconducting material of the monocrystalline type.

4. A process as claimed in claim 1, wherein the intermediate substrate is made of silicon.

* * * * *

UNITED STATES PATENT AND TRADEMARK OFFICE
CERTIFICATE OF CORRECTION

PATENT NO. : 5,042,140  
APPLICATION NO. : 07/506904  
DATED : August 27, 1991  
INVENTOR(S) : Jean-Marc Coutellier et al.

It is certified that error appears in the above-identified patent and that said Letters Patent is hereby corrected as shown below:

Title Page
At [75] Inventors, "Jacombelli" should read --Jacobelli--

Signed and Sealed this

Tenth Day of March, 2009

JOHN DOLL  
*Acting Director of the United States Patent and Trademark Office*